(12) United States Patent
Derrickson et al.

(10) Patent No.: US 11,588,044 B2
(45) Date of Patent: Feb. 21, 2023

(54) BIPOLAR JUNCTION TRANSISTOR (BJT) STRUCTURE AND RELATED METHOD

(71) Applicant: GLOBALFOUNDRIES U.S. INC., Santa Clara, CA (US)

(72) Inventors: Alexander M. Derrickson, Saratoga Springs, NY (US); Mankyu Yang, Fishkill, NY (US); Richard F. Taylor, III, Campbell, CA (US); Jagar Singh, Clifton Park, NY (US); Alexander L. Martin, Greenfield Center, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 83 days.

(21) Appl. No.: 17/109,464

(22) Filed: Dec. 2, 2020

(65) Prior Publication Data

US 2022/0173230 A1   Jun. 2, 2022

(51) Int. Cl.
*H01L 29/739* (2006.01)
*H03K 17/60* (2006.01)
*H01L 29/10* (2006.01)
*H01L 29/06* (2006.01)

(52) U.S. Cl.
CPC ...... *H01L 29/7394* (2013.01); *H01L 29/0653* (2013.01); *H01L 29/1008* (2013.01); *H03K 17/60* (2013.01)

(58) Field of Classification Search
CPC ....... H01L 29/66234; H01L 2924/1305; H01L 29/1008; H01L 29/6625; H01L 29/7394; H01L 29/0653; H01L 21/8222; H01L 29/735; H03K 17/60
See application file for complete search history.

(56) References Cited

U.S. PATENT DOCUMENTS

| | | | |
|---|---|---|---|
| 4,999,518 A * | 3/1991 | Dhong | H01L 27/0711 257/370 |
| 5,717,241 A | 2/1998 | Malhi et al. | |
| 7,173,320 B1 * | 2/2007 | Rahim | H01L 29/7394 257/E29.279 |
| 8,373,229 B2 | 2/2013 | Chen et al. | |
| 9,726,631 B1 * | 8/2017 | Cai | H01L 29/6625 |
| 9,761,664 B1 * | 9/2017 | Gao | H01L 29/1008 |

(Continued)

OTHER PUBLICATIONS

Hashemi et al., "Demonstration of Symmetric Lateral NPN Transistors on SOI Featuring Epitaxially Grown Emitter/Collector Regions," Journal of the Electron Devices Society, vol. 6, 2018, pp. 537-542.

(Continued)

*Primary Examiner* — Didarul A Mazumder
*Assistant Examiner* — Wasiul Haider
(74) *Attorney, Agent, or Firm* — Anthony Canale; Hoffman Warnick LLC

(57) ABSTRACT

Embodiments of the disclosure provide a bipolar junction transistor (BJT) structure and related method. A BJT according to the disclosure may include a base over a semiconductor substrate. A collector is over the semiconductor substrate and laterally abuts a first horizontal end of the base. An emitter is over the semiconductor substrate and laterally abuts a second horizontal end of the base opposite the first horizontal end. A horizontal interface between the emitter and the base is smaller than a horizontal interface between the collector and the base.

20 Claims, 10 Drawing Sheets

(56) References Cited

U.S. PATENT DOCUMENTS

| | | |
|---|---|---|
| 11,133,397 B2 | 9/2021 | Martin et al. |
| 2005/0023643 A1* | 2/2005 | Li .................... H01L 29/42304 |
| | | 257/E29.189 |
| 2017/0230013 A1* | 8/2017 | Hase ........................ H03F 1/56 |

OTHER PUBLICATIONS

H. J. Barnaby et al., "Minimizing Gain Degradation in Lateral PNP Bipolar Junction Transistors Using Gate Contol," IEEE Transactions on Nuclear Science, vol. 46, No. 6, Dec. 1999, 8 pages.

Athanasiou, Sotirios et al.; "Novel Ultrathin FD-SOI BiMOS Device With Reconfigurable Operation"; IEEE Transactions on Electron Devices; vol. 64; No. 3; Mar. 2017; pp. 7; Copyright 2017 IEEE; <http://www.ieee.org/publications_standards/publications/rights/index.html>.

* cited by examiner

BIPOLAR JUNCTION TRANSISTOR (BJT) STRUCTURE AND RELATED METHOD

TECHNICAL FIELD

Embodiments of the disclosure relate generally to integrated circuits (ICs). More specifically, the disclosure relates to a bipolar junction transistor (BJT) structure and related method in which a horizontal interface between the emitter and base is smaller than a horizontal interface between the collector and base.

BACKGROUND

In the microelectronics industry as well as in other industries involving construction of microscopic structures, there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, transistors, resistors, capacitors etc. Circuit chips with millions of such devices are common.

One type of transistor architecture is the bipolar junction transistor (BJT). A BJT refers to a transistor formed of three adjacent semiconductor regions (respectively known as emitter, base, and collector) with alternating conductivity types (e.g., n-p-n or p-n-p). The BJT is distinct from other types of transistors by being a "current controlled device," and thus current transmitted to the base of the transistor controls current flow between emitter and collector. BJTs may take a variety of shapes, and may include vertically-stacked semiconductor layers (i.e., vertical BJT) or horizontally-planar arrays of semiconductor material (i.e., lateral BJT). An ongoing technical concern in the case of lateral BJTs is the relatively low emitter/collector gain and electrical isolation between the emitter and portions of the base. These concerns may be avoided, in some cases, by using a vertical BJT instead of a lateral BJT. However, vertical BJTs are not practical in some designs or technical applications.

SUMMARY

An aspect of the disclosure provides a bipolar junction transistor (BJT) structure, including: a base over a semiconductor substrate; a collector over the semiconductor substrate and laterally abutting a first horizontal end of the base; and an emitter over the semiconductor substrate and laterally abutting a second horizontal end of the base opposite the first horizontal end, wherein a horizontal interface between the emitter and the base is smaller than a horizontal interface between the collector and the base.

Another aspect of the disclosure provides a bipolar junction transistor (BJT) structure, including: an intrinsic base over a semiconductor substrate, the intrinsic base having a length between a first pair of horizontal ends in a first direction, and a width between a second pair of horizontal ends in a second direction perpendicular to the first direction; a pair of extrinsic bases over the semiconductor substrate, each of the pair of extrinsic bases laterally abutting a respective one of the first pair of horizontal ends of the intrinsic base; a collector over the semiconductor substrate and laterally abutting a selected one of the second pair of horizontal ends of the intrinsic base; an emitter over the semiconductor substrate and laterally abutting the other of the second pair of horizontal ends of the intrinsic base, wherein a length of the emitter in the first direction is less than a length of the collector in the first direction, such that a horizontal interface between the emitter and the intrinsic base is smaller than a horizontal interface between the collector and the intrinsic base; a gate structure over the intrinsic base; and a first voltage source coupled to the gate structure, and configured to apply a voltage bias to the intrinsic base.

Yet another aspect of the disclosure provides a method including: providing a bipolar junction transistor (BJT) structure, including: a base over a semiconductor substrate, a collector over the semiconductor substrate and laterally abutting a first horizontal end of the base, an emitter over the semiconductor substrate and laterally abutting a second horizontal end opposite the first horizontal end of the base, wherein a horizontal interface between the emitter and the base is smaller than a horizontal interface between the collector and the base, and a gate structure over the base; applying a voltage to the gate structure; and transmitting a current from the collector to the emitter while applying the voltage to the gate structure.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
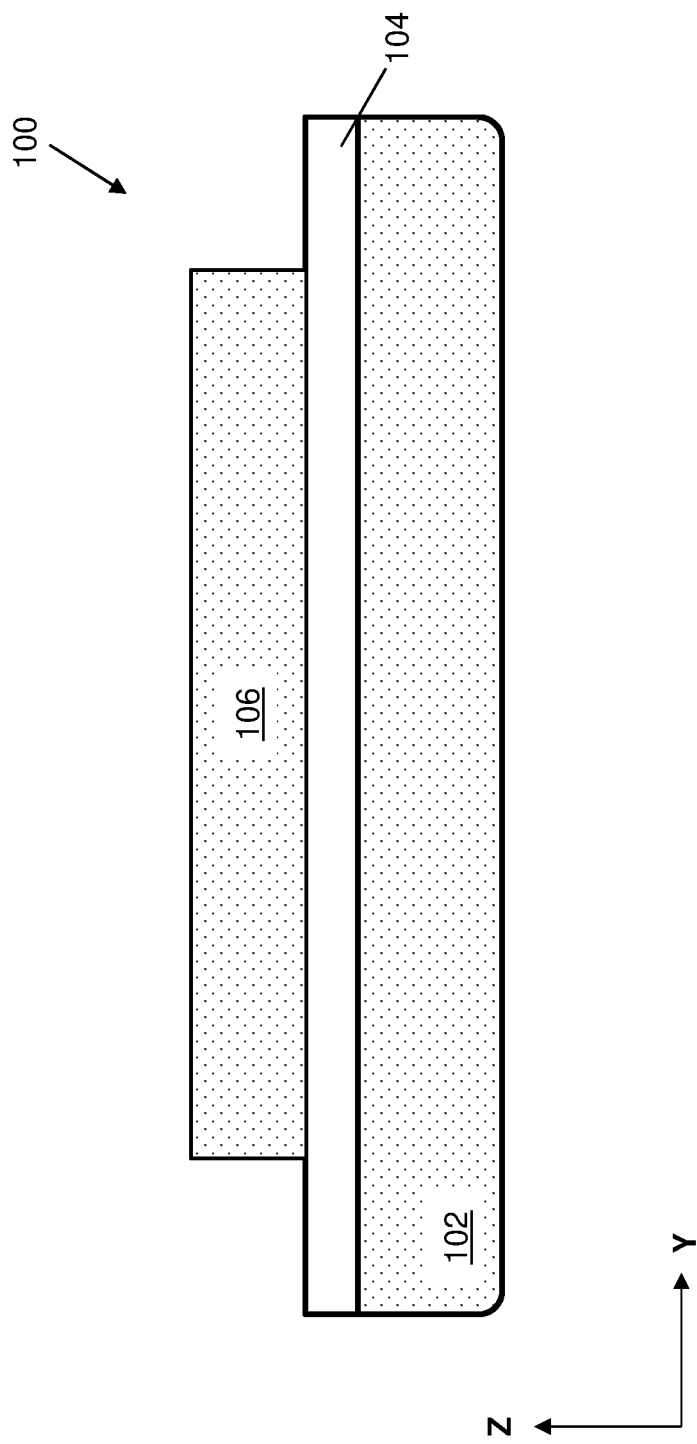
FIG. 1 shows a cross-sectional view of a preliminary structure including a semiconductor layer on a buried insulator layer according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide a bipolar junction transistor (BJT), with laterally-oriented base, collector, and emitter materials for enhanced isolation and stronger collector/emitter gain than other types of BJT structures. Such a structure may be known as a "lateral BJT." The base, collector, and emitter each may be over a semiconductor substrate, and optionally may be over an insulator layer of a fully depleted semiconductor on insulator (FDSOI) substrate. The collector may laterally abut the base along a predetermined length. The emitter may laterally abut the base opposite the collector, but with a horizontal interface along a length that is less than a horizontal interface between the collector and base. In some cases, a gate structure may be formed over the base and coupled to a voltage source for applying a voltage bias to the base. In such cases, the BJT may be "gate-assisted," such that applying a reverse bias to the base through the gate enhances current flow between the collector and emitter. Methods according to the disclosure include applying the reverse bias the base through the gate, while concurrently operating the BJT structure.

BJT structures, such as those in embodiments of the disclosure, operate through the use of multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element which behaves differently from conductive or insulative materials between two points of electrical contact. Specifically, a diode provides high conductivity from one contact to the other in one direction (i.e., the "forward" direction) but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials. IC structures according to the disclosure, and related methods, include the application of varying biases to doped semiconductor materials to create a BJT within selected portions of a device layer.

Referring to FIG. 1, a preliminary structure 100 (simply "structure" hereafter) suitable to form a BJT according to embodiments of the disclosure is shown. Preliminary structure 100 may be processed as described herein to yield one or more lateral BJT structures with distinct collector-base and emitter-base geometries, but it is understood that other techniques, ordering of processes, etc., may be implemented to yield the same BJT structure(s) or similar BJT structures in further embodiments. FIG. 1 shows a cross-sectional view of structure 100 with a substrate 102 including, e.g., one or more semiconductor materials. Substrate 102 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 102 or a portion thereof may be strained.

A buried insulator layer 104, also known in the art as a "buried oxide" or "BOX" layer, can be formed on substrate 102 to electrically isolate overlying active semiconductor materials, examples of which are discussed elsewhere herein. Buried insulator layer 104 may include one or more oxide compounds, and/or any other currently known or later-developed electrically insulative substances. Buried insulator layer 104 may be sized as narrow as possible to provide better interaction with overlying semiconductor materials, and in various embodiments may have a thickness that is at most approximately twenty-five nanometers (nm). Where transistors formed on buried insulator layer 104 also feature functional components of a similar thickness scale, structure 100 may be considered to be a "fully depleted semiconductor on insulator" (FDSOI) structure. The use of FDSOI technology provides various advantages such as an adjustable electric transistor potential by applying a bias to substrate 102 and/or semiconductor materials above buried insulator layer 104.

Structure 100 may include a preliminary semiconductor layer 106 that is located on buried insulator layer 104. Preliminary semiconductor layer 106 may be formed on buried insulator layer 104, e.g., by deposition and/or etching with the aid of various masks (not shown). Upon being formed, preliminary semiconductor layer 106 may have a predetermined height above buried insulator layer 104 and a predetermined surface area. Some portions of buried insulator layer 104 may not have preliminary semiconductor layer 106 thereon. Additionally, various conductive particles ("dopants") may be introduced into buried insulator layer 104 via a process known as "pre-doping" of preliminary semiconductor layer 106 above buried insulator layer 104.

The initial doping of preliminary semiconductor layer 106 may be P-type or N-type in a relatively low concentration, compared to subsequently-formed doped materials. P-type dopants refer to elements introduced into semiconductor material 106 to generate free holes by "accepting" electrons from a semiconductor atom and consequently "releasing" the hole. The acceptor atom must have one valence electron less than the host semiconductor. P-type dopants suitable for use in preliminary semiconductor material 106 may include but are not limited to: boron (B), indium (In) and gallium (Ga). Boron (B) is the most common acceptor in silicon technology. Further alternatives include indium and gallium (Ga). Gallium (Ga) features high diffusivity in silicon dioxide ($SiO_2$), and hence, the oxide cannot be used as a mask during Ga diffusion. N-type dopants are elements introduced into semiconductor materials to generate free electrons, e.g., by "donating" an electron to the semiconductor. N-type dopants must have one more valance electron than the semiconductor. Common N-type donors in silicon (Si) include, e.g., phosphorous (P), arsenic (As), and/or antimony (Sb). In an example implementation, preliminary semiconductor layer 106 is lightly doped with P-type dopants.

Figure 2:
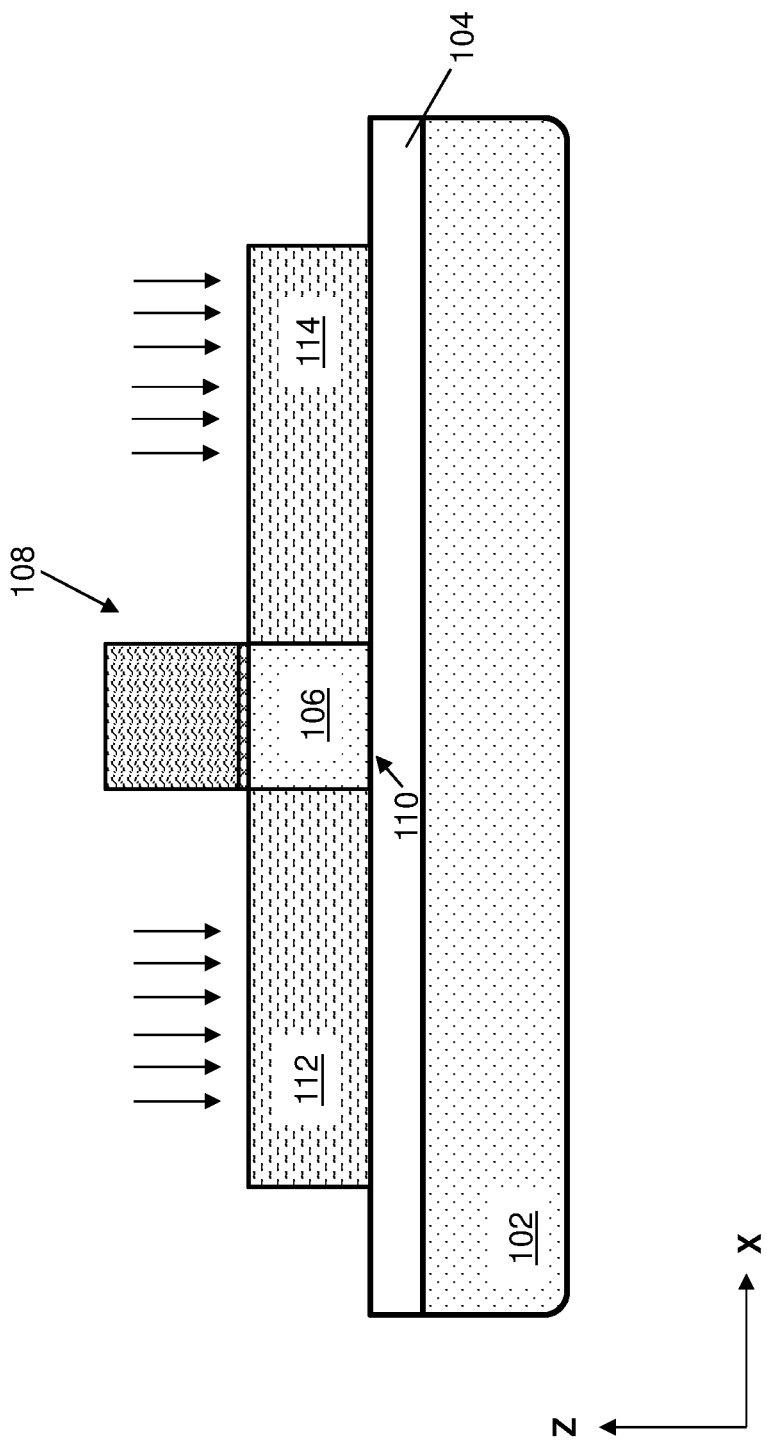
FIG. 2 shows a cross-sectional view of forming a gate structure, collector, and emitter on the preliminary structure according to embodiments of the disclosure.

Referring now to FIG. 2, a gate structure 108 may be formed over a portion of preliminary semiconductor layer 106 after a desired concentration of dopants is been formed therein. FIG. 2 depicts a cross-section in plane X-Z, whereas FIG. 1 depicts a cross-section in plane X-Y. Gate structure 108 may be a functional component of another active device (e.g., a transversely-extending gate for one or more field effect transistors (FETs)), a "dummy gate" configured for replacement with an active gate structure in subsequent processing, or in some cases may be a placeholder material used simply to prevent further doping of semiconductive materials thereunder. However gate structure 108 is embodied, an area of preliminary semiconductor layer 106 that is covered by gate structure 108 may define a base 110 in an eventual BJT structure. Base 110 of preliminary semiconductor layer 106 may be protected against further doping, modification, etc., due to the presence of gate structure 108 thereover. With gate structure 108 in place, additional semiconductor material (e.g., silicon, silicon germanium (SiGe), and/or other semiconductor materials described herein) may be formed on buried insulator layer 104 alongside preliminary semiconductor layer 106. Such materials may be epitaxially grown to a desired height above buried insulator layer 104, and may be approximately the same height as preliminary semiconductor layer 106.

Additional dopants may be formed within the semiconductor material that is alongside preliminary semiconductor layer 106, e.g., by implantation or other doping techniques. The doping of such materials may be opposite in polarity to the doping of preliminary semiconductor layer 106. In an example where preliminary semiconductor layer 106 features light P-type doping, the semiconductor materials adjacent preliminary semiconductor layer 106 may be heavily doped N-type. Gate structure 108 protects base 110 of preliminary semiconductor layer 106 from being doped together with the adjacent material(s). One region of semiconductor material adjacent base 110 defines a collector 112 of an eventual BJT structure, while the other region of semiconductor material adjacent base 110 defines an emitter 114 of an eventual BJT structure. Together, base 110, collector 112, and emitter 114 may form an NPN or PNP junction as a result of the doping, and thus define the three terminals of a bipolar junction transistor (BJT) 115.

Figure 3:
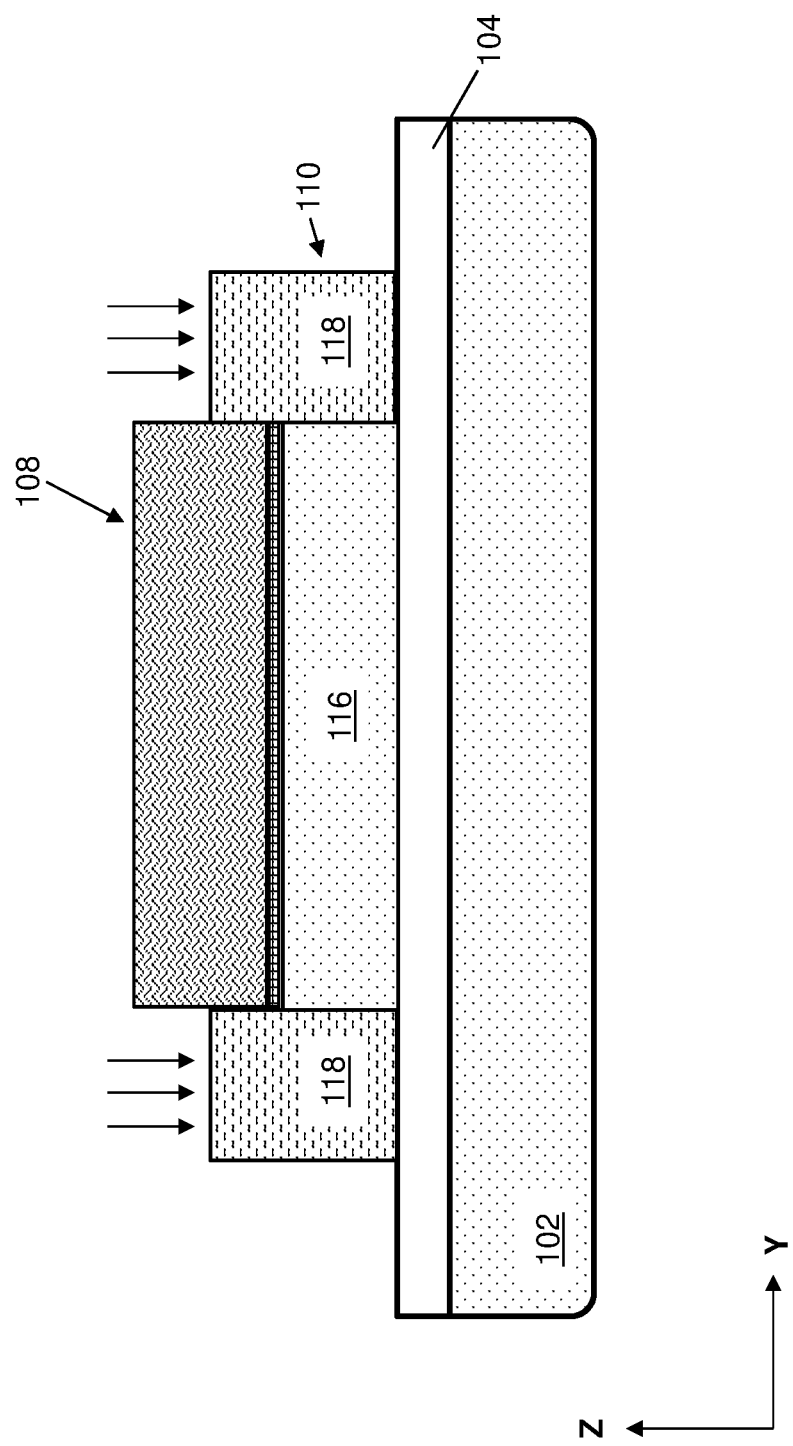
FIG. 3 shows a cross-sectional view of forming an extrinsic base from the preliminary structure according to embodiments of the disclosure.

Referring now to FIG. 3, which again shows a cross-section in the Y-Z plane, continued processing may include covering collector 112 and emitter 114 with a mask or insulator (not shown) and introducing further dopants into preliminary semiconductor layer 106 (FIGS. 1, 2) in areas not covered by gate structure 108. According to an example, portions of preliminary semiconductor layer 106 on buried insulator layer 104, but not covered by gate structure 108, may receive additional P-type dopants (e.g., by implantation or other doping procedures). These portions of semiconductor material will continue to exhibit their original doping polarity, but in a substantially higher concentration than other semiconductor materials covered by gate structure 108. The further doping thus yields an intrinsic base 116 beneath gate structure 108, and one or more extrinsic bases 118 adjacent intrinsic base 116. Despite the distinct doping concentration in extrinsic base(s) 118, intrinsic base 116 may be structurally continuous with extrinsic base(s) 118 because both regions were originally part of preliminary semiconductor layer 106. Optionally, additional doped semiconductor materials may be formed on extrinsic base(s) 118 (e.g., by epitaxial growth) to increase their height above buried insulator layer 104. Intrinsic base 116, however, retains its original size due to the presence of gate structure 108. Intrinsic base 116 and extrinsic base(s) 118 each define portions of base 110 on buried insulator layer 104. Buried insulator layer 104 thus vertically separates base 110 from substrate 102. At this stage, gate structure 108 may be removed or otherwise converted into one or more functional gate materials, as described herein.

Figure 4:
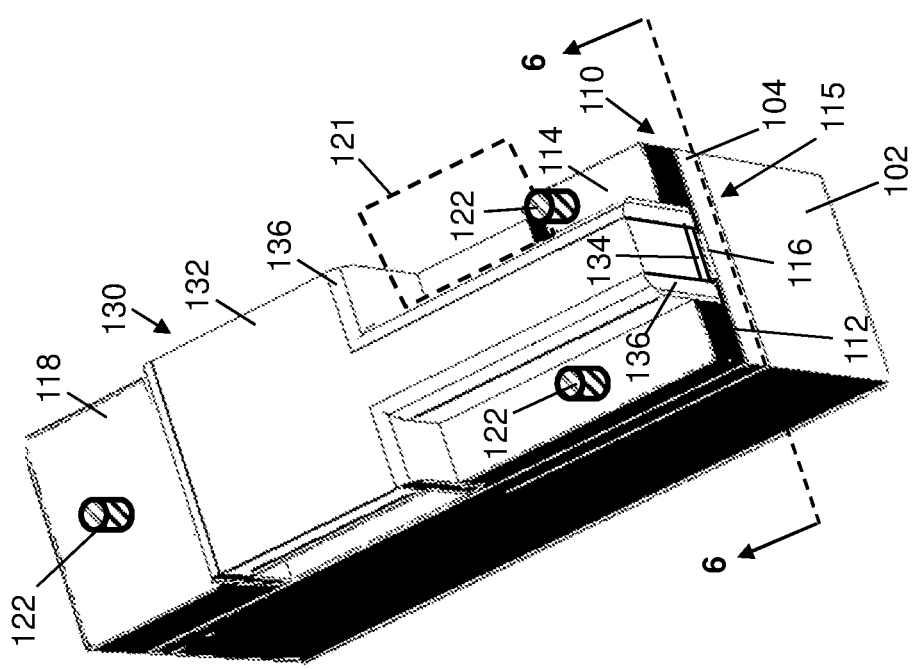
FIG. 4 shows a cut-away perspective view of a portion of a BJT structure according to embodiments of the disclosure.
Figure 5:
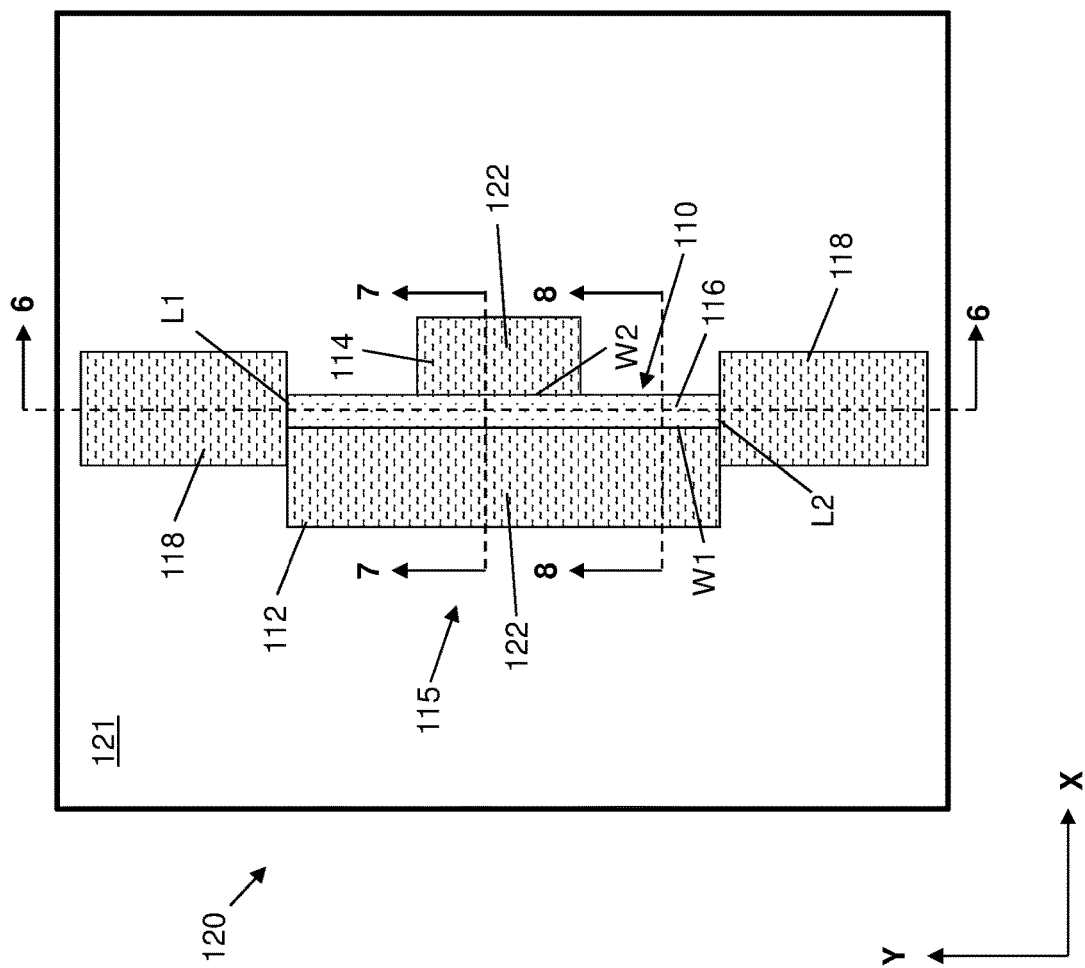
FIG. 5 shows a plan view of a bipolar junction transistor (BJT) structure according to embodiments of the disclosure.

Turning now to FIGS. 4 and 5, continued processing of the materials discussed herein may yield a BJT structure (simply "structure" hereafter) 120. FIG. 4 depicts a perspective cut-away view of structure 120, while FIG. 5 depicts a single plane of structure 120 in plane X-Y, with several materials located immediately atop buried insulator layer 104 or otherwise over substrate 102. Portions of structure 120 not depicted in FIG. 4 may be considered to be the mirror image of those shown, as the cutaway view is taken along a bisecting line through structure 130. After base 110 (including intrinsic base 116 and extrinsic base 118), collector 112, and emitter 114 are formed, an insulator 121 may be formed over substrate 102 (e.g., by deposition and planarization as discussed herein).

Insulator 121 may prevent electrical shorting and/or unintended biasing of nearby elements, and also may physically separate the various doped materials of structure 120 from various laterally distal structures. Insulator 121 may be composed of any insulating material such as $SiO_2$ or a "low-k" dielectric, which for example may have a dielectric constant that is less than 3.9. In some situations, insulator 121 may be composed of an oxide substance. Insulator 121 may be formed by forming one or more insulative materials, e.g., by deposition, and subsequent planarizing of the insulative material(s). When formed by deposition, insulator 121 may be formed after the patterning of other structures such as base 110, collector 112, and/or emitter 114.

The horizontally-oriented placement of base 110, collector 112, and emitter 114 may cause BJT 115 to be configured as a "lateral BJT." Applying a current to base 110 controls the ability for current to flow from collector 112 to emitter 114. As discussed herein, base 110 may include intrinsic base 116, having a lighter doping concentration and spanning a width in the X-axis direction and a length in the Y-axis direction. Extrinsic bases 118 are adjacent the lengthwise end(s) of intrinsic base 116, and have a substantially higher doping concentration (e.g., as a result of the separate doping operation depicted in FIG. 3). Extrinsic base(s) 118 may have a height that is greater than intrinsic base 116, and thus extrinsic base(s) 118 may have a top surface (i.e., oriented in the positive Z-axis direction) that is above the top surface of intrinsic base 116.

Base 110 may have a first horizontal end W1 in the X-axis direction, and a second horizontal end W2 in the X-axis direction, opposite first horizontal end W1. In some cases, horizontal ends W1, W2 refer specifically to the horizontal ends of intrinsic base 116. Collector 112 may laterally abut first horizontal end W1 of base 110, while emitter 114 may laterally abut an opposite horizontal end W2 of base 110. As discussed elsewhere herein, base 110 may have a first doping type (i.e., P-type or N-type doping) while collector 112 and emitter 114 have the opposite doping type, thereby forming a P-N-P or N-P-N junction in the X-axis direction. Collector 112 and emitter 114 may have the opposite doping type from base 110. Where base 110 is doped P-type, collector 112 and emitter may be doped N-type, or vice versa.

As shown specifically in FIGS. 4 and 5, collector 112 may have a different size from emitter 114 in various embodiments of structure 120. For instance, emitter 114 may be smaller than collector 112 and thus may have a horizontal interface with base 110 that is smaller than the horizontal interface between collector 112 and base 110. In this case, emitter 114 may have a length in parallel with intrinsic base 116 that is less than a length of collector 112 along the same direction, thus providing the smaller horizontal interface with base 110 relative to collector 112. Such a configuration may be provided, e.g., by forming emitter 114 from a smaller area of deposited or grown semiconductor material, and/or removing portions of semiconductor material from emitter 114 after both collector 112 and emitter 114 are formed. Due to the smaller horizontal interface between emitter 114 and base 110, relative to the horizontal interface between collector 112 and base 110, some portions of insulator 121 may be horizontally between emitter 114 and base 110 along the Y-axis direction. Here, insulator 121 may horizontally separate emitter 114 from extrinsic base(s) 118, as shown in FIG. 5. The location of insulator 121 between emitter 114 and base 110 is indicated with a dash outline in FIG. 4 for emphasis.

Various conductive materials may electrically connect the various portions of structure 120 (e.g., base 110, collector 112, and emitter 114) to other elements of an IC structure. Such materials may include contacts 122 (FIG. 1 only) formed on structure 120 and/or partially within overlying materials (e.g., insulator 121). Contact(s) 122 may be formed of, e.g., one or more conductive metals and/or conductive silicide regions. Extrinsic base(s) 118 may have contact(s) 122 thereon, and collector 112 and emitter 114 each may have one or more contact(s) 122 for defining electrical terminals of BJT 115 (base 110, collector 112, emitter 114) in structure 120. Contact(s) 122 additionally may include, e.g., refractory metal liners (not shown) to horizontally separate conductive materials of contact(s) 122 from nearby portions of insulator 121 and/or other horizontally adjacent materials. Such liners may include materials such as but not limited to: tantalum nitride (TaN) and tantalum; tantalum nitride, tantalum and cobalt; and magnesium (Mn), or combinations thereof.

Structure 120 optionally may include a gate structure 130 (FIG. 1) over base 110 of BJT 115, including intrinsic base 116 and perhaps some portions of extrinsic base(s) 118. Gate structure 130 may be the same as gate structure 108 (FIGS. 1-3) described herein for targeted growth and doping of semiconductor materials over buried insulator layer 104, or may be an electrically active "replacement metal gate" that is formed in place of the earlier-described gate structure 108. However embodied, gate structure 130 may electrically couple a biasing voltage to base 110 (e.g., reverse bias through a negative voltage) thereby affecting current flow from collector 112 to emitter 114 through intrinsic base 116 by increasing the ability for charge carriers to flow through doped semiconductor material in base 110. Gate structure 130, where included, does not directly control whether current flow from collector 112 to emitter 114 is enabled or disabled, as this function is controlled through current applied to base 110. Instead, gate structure 130 allows current to flow from collector 112 to emitter 114 when negatively biased, when current flow to base 110 has already enabled current flow from collector 112 to emitter 114.

It will be appreciated by those skilled in the art that gate structure 130 may include one or more layers, potentially forming a gate stack. Gate structure 130 may include a gate conductor 132 formed from doped or undoped polycrystalline silicon (poly-Si) according to one example. In further examples, gate conductor 132 may include materials such as, but not limited to, aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), tungsten (W), tungsten nitride (WN), tungsten carbide (WC), and/or combinations thereof.

Gate structure 130 may include a gate dielectric layer 134 over base 110 (e.g., at least extrinsic base 116). Gate dielectric layer 134 may include a high-k dielectric, such as, but not limited to: metal oxides tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Gate dielectric layer 134 may include any conceivable insulating material, such as, but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, hydrogenated silicon oxycarbide (SiCOH), porous SiCOH, porous methylsilsesquioxanes (MSQ), porous hydrogensilsesquioxanes (HSQ), octamethylcyclotetrasiloxane (OMCTS) $[(CH_3)_2SiO]_4$ 2.7 available from Air Liquide, etc., or other low dielectric constant (k<3.9) material, or combinations thereof. Gate dielectric layer 134 may also include high-k dielectric materials, such as, but not limited to, hafnium silicate (HfSiO), zirconium silicate ($ZrSiO_x$), silicon oxynitride (SiON), or any combination of these materials. For horizontal electrical isolation from other materials, gate structure 130 may include various spacers 136 within and/or on sidewalls of gate structure 130. Spacer(s) 136 may include various nitride insulators, and/or other insulative materials described herein with respect to buried insulator layer 104 and/or insulator 121.

Figure 6:
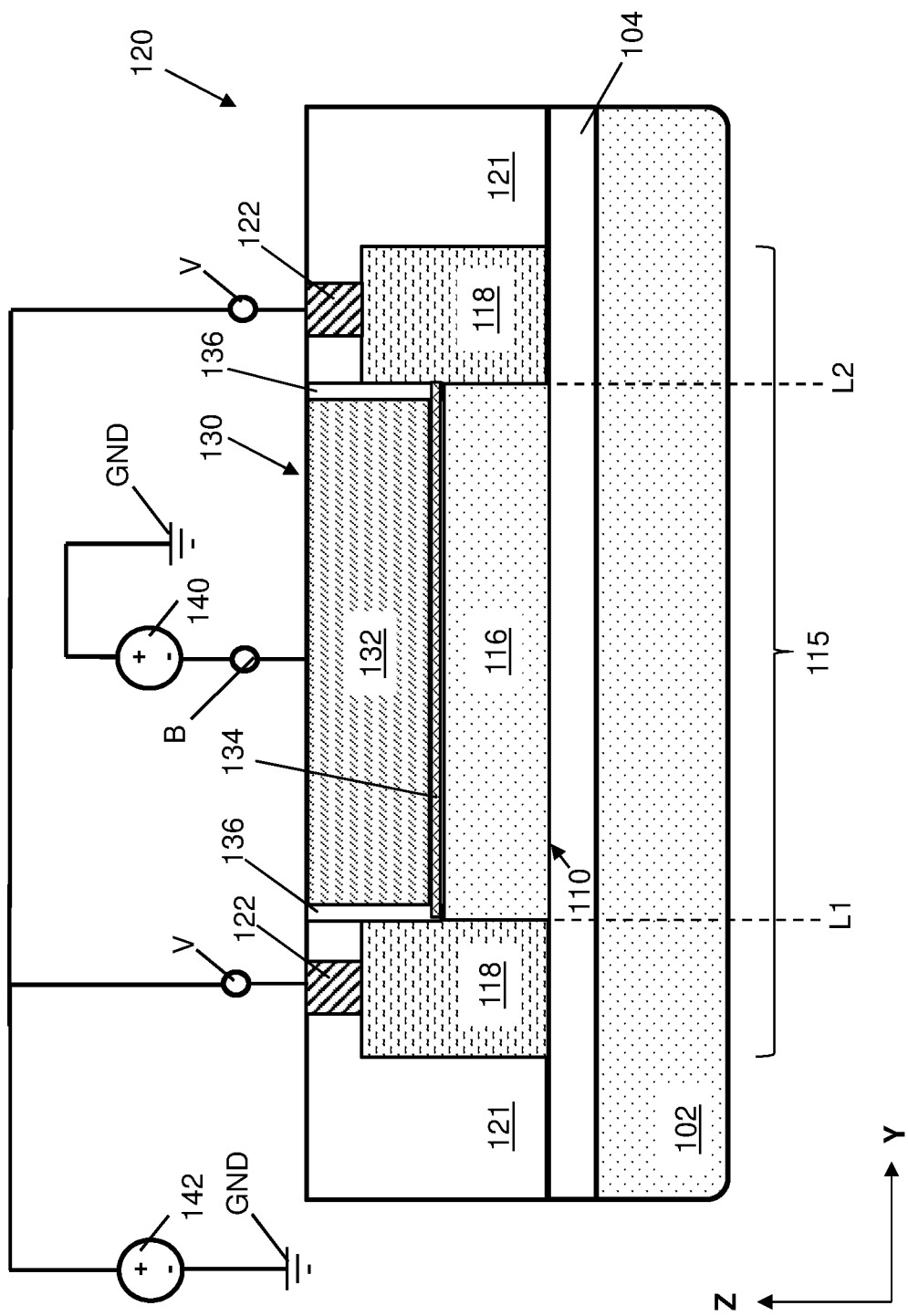
FIG. 6 shows a cross-sectional view along line 3-3 in FIG. 1 of a BJT structure according to embodiments of the disclosure.
Figure 7:
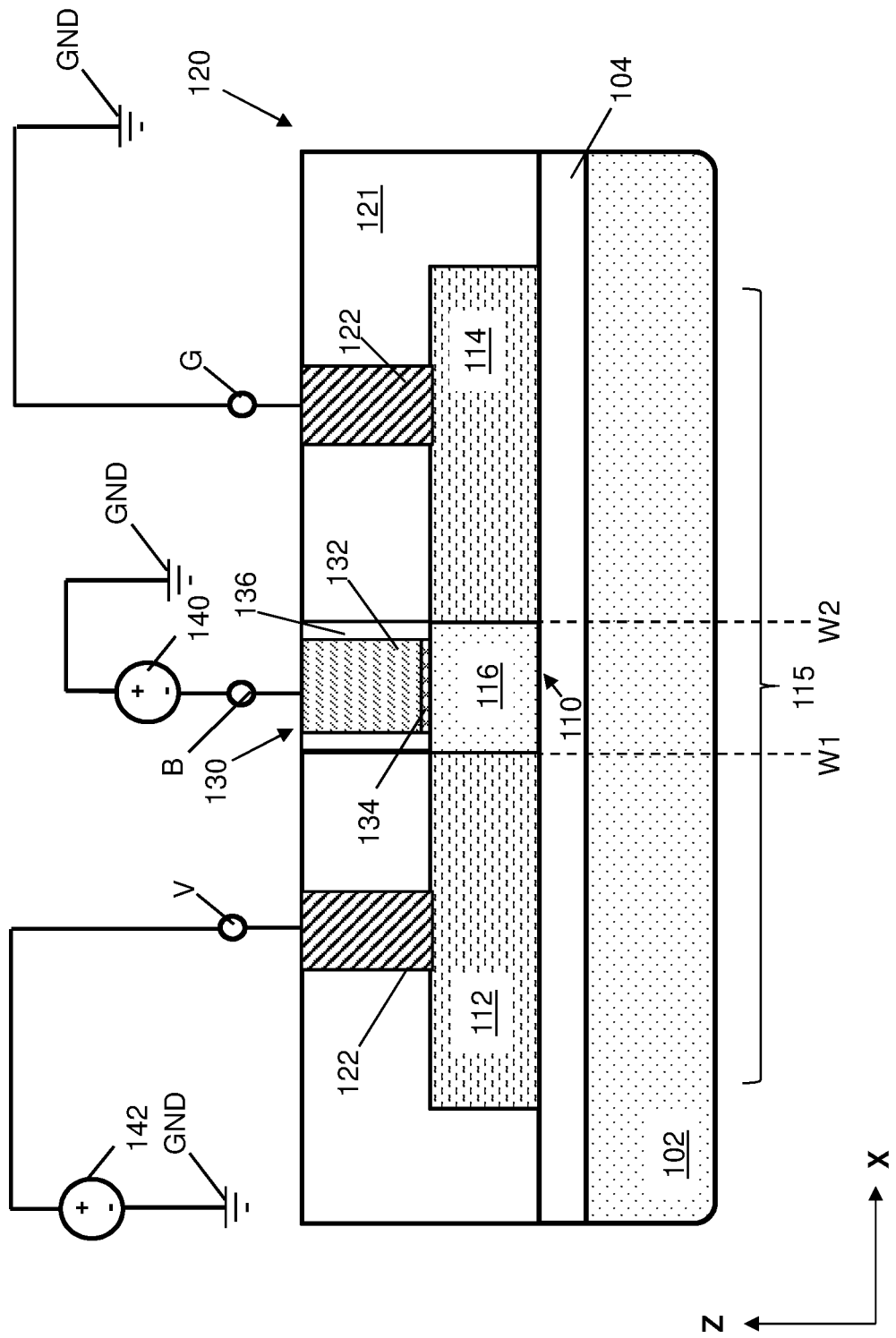
FIG. 7 shows a cross-sectional view along line 4-4 in FIG. 2 of a BJT structure according to embodiments of the disclosure.
Figure 8:
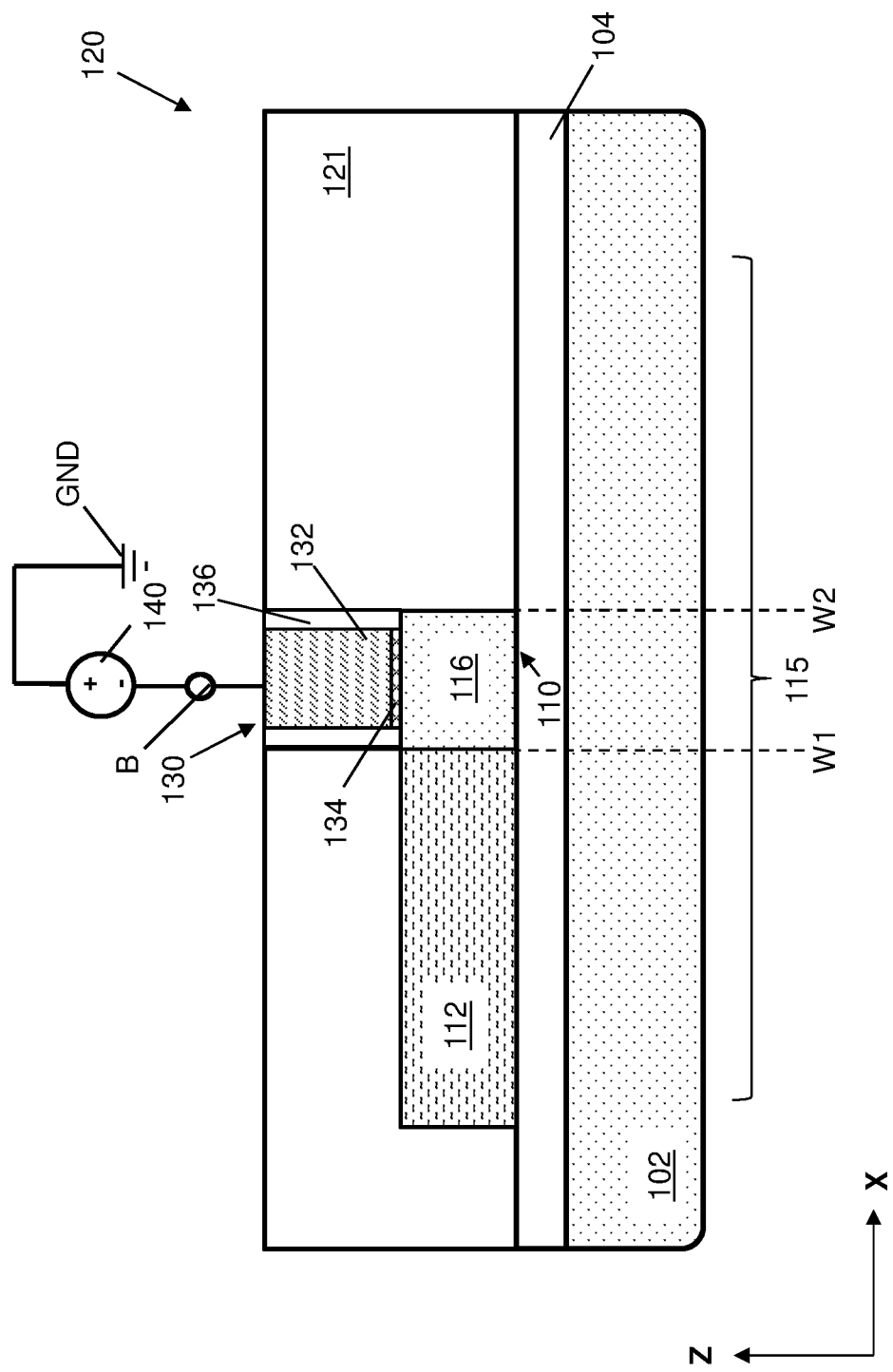
FIG. 8 shows a cross-sectional view along line 5-5 in FIG. 2 of a BJT structure according to embodiments of the disclosure.

FIGS. 6-8 provide cross-sectional views of structure 120, along lines 6-6, 7-7, and 8-8, respectively, of FIG. 5. FIG. 6 provides a lengthwise view of structure 120 in plane Y-Z. FIGS. 7 and 8 depict the width of structure 120 in plane X-Z along two cross-sections. Each view depicts components for applying one or more voltages to portions of structure 120 discussed herein. A first voltage source 140 may be coupled to gate structure 130, in implementations where gate structure 130 is present over base 110. First voltage source 140 may have a positive terminal coupled to ground GND, and a negative terminal set to a first voltage level B and coupled to gate conductor 132 of gate structure 130. First voltage source 140 applies a reverse bias to base 110 through gate dielectric layer 134 (e.g., at intrinsic base 116), i.e., the voltage polarity of first voltage level B is opposite the voltage polarity in BJT 115. The applied bias voltage in gate structure 130 may induce a difference in voltage between gate 130, and portions of base 110 thereunder. For example, where BJT 115 operates by application of positive voltage to base 110, gate structure 130 may have a negative voltage to induce a reverse bias. Among other effects, this larger difference in electrical potential can affect the voltage at base 110 needed to induce current flow from collector 112 to emitter 114.

A second voltage source 142 (FIGS. 3, 4) having a second voltage level "V" may be electrically coupled between an electrical ground GND and contacts 122 to base 110 (e.g., coupled to extrinsic base 118 of base 110). Second voltage level V may be configured to apply at least a threshold current to base 110, thereby enabling current flow from collector 112 (FIGS. 4, 5) to emitter 114. As second voltage source 142 applies an electrical potential to contact(s) 122, an electric current is induced to doped semiconductor materials within extrinsic base 118 thereunder. In turn, the induced current within extrinsic base 118 is also induced within intrinsic base 116 due to its position alongside intrinsic base 116. The current induced within intrinsic base 116 may be less than the current within extrinsic base 118, e.g., due to the lower concentration of dopants within intrinsic base 116 as compared with extrinsic base 118. When second voltage source 142 selectively applies an electric potential to base 110 through contact(s) 122, it controls the current flow from collector 112 to emitter 114.

As shown specifically in FIGS. 7 and 8, second voltage source 142 may also be coupled to contact 122 to collector 112 of structure 120. In this configuration, collector 112 is set to second voltage level V in parallel with base 110 (e.g., extrinsic base(s) 118 thereof). Along the cross-section shown in FIG. 4, collector 112 may transmit an induced current from second voltage source 142 through base 110 to emitter 114, during application of second voltage level V to base 110. Emitter 114, in turn, may be coupled to ground GND and/or another interconnected electrical element through contact(s) 122 thereon. Thus, emitter 114 is not coupled to second voltage source 142 in parallel with base 110 and collector 112, and may have a third voltage level G that is different from second voltage level V. Due to differences in the size of emitter 114 relative to collector 112, and its horizontal interface with base 110 as compared with collector 112, emitter 114 may not horizontally abut base 110 along the cross-section of structure 120 shown in FIG. 8.

Figure 9:
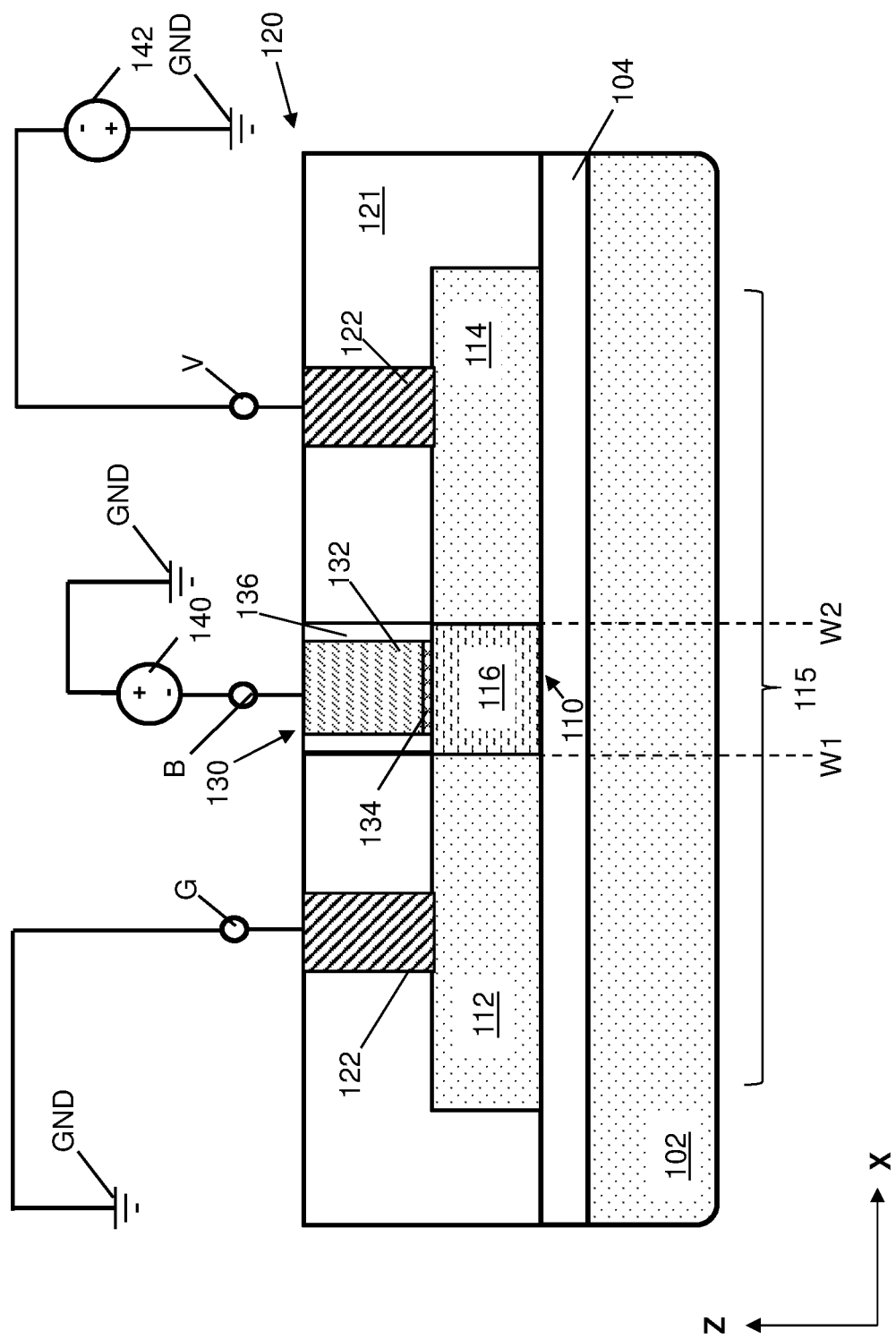
FIG. 9 provides a cross-sectional view of a BJT structure with an alternate doping configuration according to further embodiments of the disclosure.

Referring to FIG. 9, a further configuration of structure 120 with alternative doping is shown. In some implementations, collector 112 and emitter 114 may be doped P-type while intrinsic base 116 is doped N-type to form a PNP junction, in an opposite configuration from that shown in other implementations (e.g., NPN junction example of FIGS. 4-8). In such an implementation, emitter 114 may be coupled to second voltage source 142 in parallel with extrinsic base(s) 118 (FIG. 6), e.g., as discussed elsewhere herein. In this case, gate structure 132 may be coupled to first voltage source 140 in the same manner as other configurations. Thus, structure 120 is adaptable to alternate doping profiles and/or polarities to suit a variety of devices and/or implementations.

Figure 10:
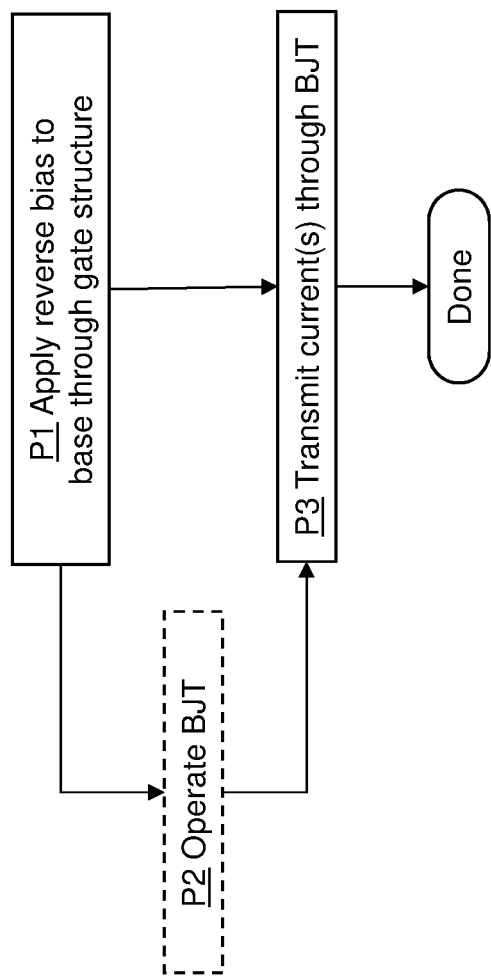
FIG. 10 provides an illustrative flow diagram of a method according to embodiments of the disclosure.

Turning to FIGS. 4, 5, and 10, embodiments of the disclosure provide methods to operate structure 120, e.g., with base 110, collector 112, emitter 114, and gate structure 130. Embodiments of the disclosure assist the operation of BJT 115 terminals (i.e., base 110, collector 112, emitter 114) within structure 120 through the use of gate structure 130, even without gate structure 130 being one of, or an active portion of, the BJT 115. To practice methods according to the disclosure, structure 120 may include BJT 115 with base 110 horizontally abutting collector 112 at first horizontal end W1, and horizontally abutting emitter 114 at second horizontal end W2. The horizontal interface between base 110 and emitter 114, denoted by respective sidewalls in horizontal contact with each other, may be smaller than the horizontal interface between base 110 and collector 112 (i.e., due to collector 112 and emitter 114 being of different size). Gate structure 130 (including, e.g., gate conductor 132, gate dielectric layer 134, spacer 136, etc.) may be over base 110 so as to electrically bias portions thereof (e.g., intrinsic base 116) without being electrically coupled thereto.

Process P1 may include applying a reverse bias to base 110 through gate structure 130. Applying the reverse bias in process P1 may be implemented through the use of first voltage source 140 (FIGS. 3-5), or another electrical element coupled to gate conductor 132. The reverse bias may influence charge mobility through intrinsic base 116 or other portions of base 110 located under gate structure 130, to aid current flow from collector 112 to emitter 114. Process P2 in embodiments of the disclosure, which may be concurrent with process P1 or initiated via an operator of structure 120, may include operating BJT 115 terminals (i.e., base 110, collector 112, and emitter 114) while the reverse bias is applied to base 110 through gate structure 130. The operating of BJT 115 in process P2, where applicable, may include controlling the voltage bias to base 110 (e.g., through second voltage source 142). In any case, process P3 may include transmitting a current to collector 112, e.g., through second voltage source 142. The transmitted current may flow from collector 112 to emitter 114 through base 110, as enabled via an applied voltage to base 110 and a reverse voltage bias in gate structure 130. Thus, methods according to the disclosure include processes to assist the operation of base 110, collector 112, and emitter 114 through gate structure 130 thereover.

Embodiments of the disclosure provide various technical and commercial advantages, several examples of which are discussed herein. Embodiments of the disclosure counteract relatively low amounts of gain and electrical isolation in lateral bipolar transistor structures, by using a gate structure over the lateral bipolar transistor to control current modulation and flow through the underlying base. The use of a gate structure architecture typically used for a FET device may allow embodiments of the disclosure to easily be formed and integrated into conventional process flows to form various structures on a device layer of an IC. Further, the use of differently-sized collector and emitter structures may force the bipolar transistor to exhibit a distinct amount of gain across its collector and emitter terminals, even when the overlying gate structure is omitted.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate+/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A lateral bipolar junction transistor (BJT) structure, comprising:
   a base over a semiconductor substrate;
   a collector over the semiconductor substrate and laterally abutting a first horizontal end of the base; and
   an emitter over the semiconductor substrate and laterally abutting a second horizontal end of the base opposite the first horizontal end, wherein a horizontal interface between the emitter and the base is smaller than a horizontal interface between the collector and the base.

2. The lateral BJT structure of claim 1, further comprising a buried insulator layer above the semiconductor substrate and below the base, the collector, and the emitter.

3. The lateral BJT structure of claim 2, wherein the base, the collector, and the emitter include portions of a fully depleted semiconductor on insulator (FDSOI) layer on the buried insulator layer.

4. The lateral BJT structure of claim 1, further comprising a gate structure over the base, and configured to electrically bias the base.

5. The lateral BJT structure of claim 4, further comprising a voltage source coupled to the gate structure, wherein a voltage level of the voltage source causes the gate structure to apply a reverse bias to the base.

6. The lateral BJT structure of claim 1, wherein the base includes an intrinsic base between the emitter and the collector, and an extrinsic base adjacent the intrinsic base, wherein a dopant concentration within the intrinsic base is less than a dopant concentration within the extrinsic base, and wherein a lower surface of the intrinsic base is substantially aligned with a lower surface of the emitter and a lower surface of the collector.

7. The lateral BJT structure of claim 6, further comprising an insulator laterally abutting the intrinsic base, wherein the insulator separates the emitter from the extrinsic base, and wherein an uppermost surface of the extrinsic base is above an upper surface of the intrinsic base.

8. A bipolar junction transistor (BJT) structure, comprising:
   an intrinsic base over a semiconductor substrate, the intrinsic base having a length between a first pair of horizontal ends in a first direction, and a width between a second pair of horizontal ends in a second direction perpendicular to the first direction;
   a pair of extrinsic bases over the semiconductor substrate, each of the pair of extrinsic bases laterally abutting a respective one of the first pair of horizontal ends of the intrinsic base;
   a collector over the semiconductor substrate and laterally abutting a selected one of the second pair of horizontal ends of the intrinsic base;
   an emitter over the semiconductor substrate and laterally abutting the other of the second pair of horizontal ends of the intrinsic base, wherein a length of the emitter in the first direction is less than a length of the collector in the first direction, such that a horizontal interface between the emitter and the intrinsic base is smaller than a horizontal interface between the collector and the intrinsic base, and wherein a lower surface of the intrinsic base is substantially aligned with a lower surface of the emitter and a lower surface of the collector;
   a gate structure over the intrinsic base; and
   a first voltage source coupled to the gate structure, and configured to apply a voltage bias to the intrinsic base.

9. The BJT structure of claim 8, further comprising a buried insulator layer above the semiconductor substrate and below the intrinsic base, the pair of extrinsic bases, the collector, and the emitter.

10. The BJT structure of claim 9, wherein the intrinsic base, the pair of extrinsic bases, the collector, and the emitter include portions of a fully depleted semiconductor on insulator (FDSOI) layer on the buried insulator layer.

11. The BJT structure of claim 8, further comprising an insulator laterally abutting the other of the second pair of horizontal ends of the extrinsic base, wherein the insulator laterally abuts the emitter, and wherein the extrinsic base and the intrinsic base are structurally continuous.

12. The BJT structure of claim 11, wherein the insulator includes a pair of insulator regions, each of the pair of insulator regions being laterally between the emitter and a respective one of the pair of extrinsic bases.

13. The BJT structure of claim 8, wherein the emitter is coupled to ground, and wherein the collector and the pair of extrinsic bases are electrically coupled to a second voltage source.

14. The BJT structure of claim 8, wherein the collector is coupled to ground, and wherein the emitter and the pair of extrinsic bases are electrically coupled to a second voltage source.

15. A method comprising:
applying a voltage to a gate structure of a bipolar junction transistor (BJT), the gate structure configured to apply a voltage bias to an intrinsic base and the BJT including:
  the intrinsic base over a semiconductor substrate, the intrinsic base having a length between a first pair of horizontal ends in a first direction, and a width between a second pair of horizontal ends in a second direction perpendicular to the first direction;
  a pair of extrinsic bases over the semiconductor substrate, each of the pair of extrinsic bases laterally abutting a respective one of the first pair of horizontal ends of the intrinsic base;
  a collector over the semiconductor substrate and laterally abutting a first horizontal end of the intrinsic base, and
  an emitter over the semiconductor substrate and laterally abutting a second horizontal end opposite the first horizontal end of the intrinsic base, wherein a horizontal interface between the emitter and the intrinsic base is smaller than a horizontal interface between the collector and the intrinsic base and wherein a lower surface of the intrinsic base is substantially aligned with a lower surface of the emitter and a lower surface of the collector,
  wherein the gate structure of the BJT is over and electrically coupled to the intrinsic base; and
transmitting a current from the collector to the emitter while applying the voltage to the gate structure.

16. The method of claim 15, further comprising controlling a polarity of the voltage to apply a reverse bias to the base through the gate structure.

17. The method of claim 15, further comprising electrically coupling the base and the collector of the BJT to a voltage source, and electrically coupling the emitter of the BJT to ground.

18. The method of claim 15, further comprising electrically coupling the base and the emitter of the BJT to a voltage source, and electrically coupling the collector of the BJT to ground.

19. The method of claim 15, wherein a gate dielectric layer between the base and the gate structure prevents the applied voltage from inducing a current within the base of the BJT.

20. The method of claim 15, further comprising transmitting the current through at least one of the extrinsic base region coupled to the intrinsic base of the BJT.

* * * * *